United States Patent
Kajiyama et al.

(10) Patent No.: US 7,064,402 B2
(45) Date of Patent: Jun. 20, 2006

(54) MAGNETIC RANDOM ACCESS MEMORY

(75) Inventors: Takeshi Kajiyama, Yokohama (JP);
Tomomasa Ueda, Yokohama (JP);
Tatsuya Kishi, Yokohama (JP);
Hisanori Aikawa, Yokohama (JP);
Masatoshi Yoshikawa, Yokohama (JP);
Yoshiaki Asao, Sagamihara (JP);
Hiroaki Yoda, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/189,851

(22) Filed: Jul. 27, 2005

(65) Prior Publication Data

US 2005/0259464 A1 Nov. 24, 2005

Related U.S. Application Data

(63) Continuation of application No. 10/847,384, filed on May 18, 2004, now Pat. No. 6,984,865.

(30) Foreign Application Priority Data

Mar. 12, 2004 (JP) .............................. 2004-071390

(51) Int. Cl.
*H01L 29/82* (2006.01)
(52) U.S. Cl. ......................................... 257/421; 438/48
(58) Field of Classification Search ................ 257/295, 257/421, 422, 427; 438/3, 48, 73; 365/158, 365/171, 173
See application file for complete search history.

(56) References Cited

U.S. PATENT DOCUMENTS

| 5,940,319 | A | * | 8/1999 | Durlam et al. .............. 365/171 |
| 6,430,085 | B1 | | 8/2002 | Rizzo |
| 6,548,849 | B1 | | 4/2003 | Pan et al. |
| 6,555,858 | B1 | | 4/2003 | Jones et al. |

FOREIGN PATENT DOCUMENTS

JP 2003-209227 7/2003

OTHER PUBLICATIONS esp@cenet - English Abstract of JP2003209227.

* cited by examiner

*Primary Examiner*—David Vu
(74) *Attorney, Agent, or Firm*—Oblon, Spivak, McClelland, Maier & Neustadt, P.C.

(57) ABSTRACT

A magnetic random access memory concerning an example of the present invention comprises a magneto resistive element, a first insulating layer which covers side surfaces of the magneto resistive element, a second insulating layer which is arranged on the first insulating layer and has a first groove on the magneto resistive element, a write line which fills the first groove and is connected with the magneto resistive element, and a third insulating layer which is arranged between the first and second insulating layers except a bottom portion of the first groove and has an etching selection ratio with respect to at least the first and second insulating layers.

14 Claims, 10 Drawing Sheets

Memory cell array section | Peripheral circuit section or logic section

Memory cell array section | Peripheral circuit section or logic section

Memory cell array section | Peripheral circuit section or logic section (End section of write bit line)

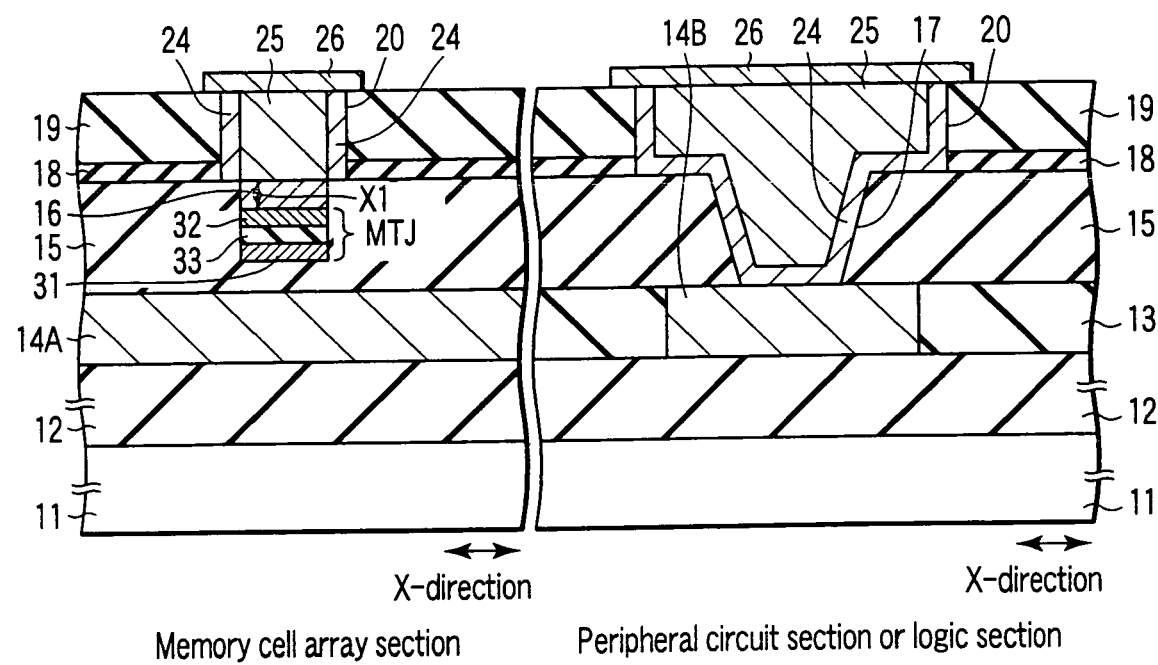
F I G. 7

Memory cell array section    Peripheral circuit section or logic section

Memory cell array section    Peripheral circuit section or logic section

Memory cell array section    Peripheral circuit section or logic section

US 7,064,402 B2

MAGNETIC RANDOM ACCESS MEMORY

This application is a continuation of Ser. No. 10/847,384 May 18, 2004, now U.S. Pat. No. 6,984,865

CROSS-REFERENCE TO RELATED APPLICATIONS

This application is based upon and claims the benefit of priority from prior Japanese Patent Application No. 2004-071390, filed Mar. 12, 2004, the entire contents of which are incorporated herein by reference.

BACKGROUND OF THE INVENTION

1. Field of the Invention

The present invention relates to a magnetic random access memory (MRAM) which utilizes a magneto resistive effect.

2. Description of the Related Art

A magnetic resistive random access memory which utilizes a tunneling magneto resistive effect (TMR) is characterized in storing data by using a magnetization state of an MTJ (Magnetic Tunnel Junction) element.

In recent years, there has been developed a yoke wiring technique (e.g., see Jpn. Pat. Appln. KOKAI No. 2003-209227) by which a yoke layer is provided around a write line for generating a magnetic field for the purpose of causing a magnetic field to efficiently act on an MTJ element.

(1) As one of the yoke wiring techniques, there has been known a process to form a yoke wiring by using RIE (Reactive Ion Etching).

FIG. 1 shows an example of a yoke wiring structure formed by RIE.

In a memory cell array section, a write word line 14A surrounded by an insulating layer (e.g., silicon oxide) 12A is arranged above a silicon substrate 11. An MTJ element MTJ is arranged above the write word line 14A. A write bit line 25A is arranged above the MTJ element MTJ through a cap layer 16. Yoke layers 26A and 26B are respectively arranged on side surfaces and a top surface of the write word bit line 25A.

Here, when forming the write bit line 25A by an RIE process, the workability of the write bit line 25A is very good. Further, the yoke layer 26A can be readily formed by a side wall process based on, e.g., CVD (Chemical Vapor Deposition) and RIE, and the yoke layer 26B can be likewise easily formed by, e.g., CVD and PEP (Photo Engraving process).

Usually, however, in the RIE process, the write bit line 25A is constituted of aluminum. In recent years, regarding the increase in demands for so-called low-temperature processes, it is well known that aluminium has poor coverage in a via hole.

In this case, in a via hole in a peripheral circuit section or a logic section, e.g., at an end section of the write bit line 25A, the coverage of aluminium as the write bit line 25A is deteriorated, thus there occurs a problem that the reliability is considerably lowered in a relationship with a signal line 14B.

Thus, in the magnetic random access memory, an adoption of a damascene process which can realize the low-temperature process without lowering the reliability in a via hole has been examined.

(2) A technique to form a yoke wiring by using a damascene process (including a dual damascene process) will now be described hereinafter.

FIG. 2 shows an example of a yoke wiring structure formed by the damascene process.

Insulating layers (e.g., silicon oxide) 12 and 13 are arranged on a silicon substrate 11. A plurality of wiring grooves are formed to the insulating layer 13, and a write word line 14A and a signal line 14B are arranged in these wiring grooves. An MTJ element MTJ is arranged on the write word line 14A. A write bit line 25 is arranged above the MTJ element MTJ through a cap layer 16. Yoke layers 24 and 26 are respectively arranged on side surfaces and a top surface of the write bit line 25. The write bit line 25 is filled in a wiring groove 20 formed to an insulating layer (e.g., silicon oxide) 19.

According to this damascene process, since copper as the write bit line 25 is completely filled in a via hole 17 in a peripheral circuit section or a logic section, e.g., at an end section of the write bit line 25, the reliability can be greatly improved in a relationship with the signal line 14B.

However, the damascene process has a problem.

In the magnetic random access memory, in order to reduce a value of a write current flowing through the write bit line 25, a magnetic field generated by the write current must be caused to efficiently act on the MTJ element MTJ.

As one of such methods, there has been an attempt to shorten a distance between the MTJ element MTJ and the write bit line 25.

However, as shown in, e.g., FIG. 3, reducing a thickness X1 of a cap layer 16 in order to shorten a distance between the MTJ element MTJ and the write bit line 25 may cause side surfaces of the MTJ element MTJ to be exposed due to over-etching at the time of RIE to form the wiring groove 20 to the insulting layer 19. In this case, when an electroconductive layer is filled in the wiring groove 20, a pin layer 31 and a free layer 32 of the MTJ element MTJ short-circuit, thereby generating a bit defect.

It is apparent that such a phenomenon will become a serious problem in future with a demand to set the thickness X1 of the cap layer 16 to be 5 to 100 nm, whilst a thickness of the insulating layer 19 is 300 to 500 nm and an over-etching quantity (margin) of the insulating layer 19 in RIE is approximately 10 to 30% of the thickness of the insulating layer 19.

It is to be noted that sufficiently increasing a thickness X2 of the cap layer 16 as shown in FIG. 4 can avoid such a problem, but if this is done, a distance between the MTJ element MTJ and the write bit line 25 becomes too large, which is counter-productive.

BRIEF SUMMARY OF THE INVENTION

A magnetic random access memory according to an aspect of the present invention comprises: a magneto resistive element; a first insulating layer which covers side surfaces of the magneto resistive element; a second insulating layer which is arranged on the first insulating layer and has a first groove on the magneto resistive element; a write line which fills the first groove and is connected with the magneto resistive element; and a third insulating layer which is arranged between the first and second insulating layers except a bottom portion of the first groove and has an etching selection ratio with respect to at least the first and second insulating layers.

A method for manufacturing a magnetic random access memory according to an aspect of the present invention comprises: a step of forming a cap layer on a magneto resistive element; a step of forming a first insulating layer which covers the magneto resistive element and the cap layer and has a top surface thereof at the level of a top surface of the cap layer; a step of forming a second insulating layer on the first insulating layer; a step of removing the second insulating layer existing around a memory cell array section to which the magneto resistive element is arranged; a step of forming a third insulating layer on the first and second insulating layers; a step of etching the third insulating layer, forming a first groove at an upper portion of the cap layer and forming a second groove around the memory cell array section; a step of etching the second insulating layer exposed on a bottom portion of the first groove, and a step of filling an electroconductive layer in the first and second grooves.

BRIEF DESCRIPTION OF THE SEVERAL VIEWS OF THE DRAWING

FIG. 7 is a cross-sectional view showing a device structure according to an example of the present invention;

DETAILED DESCRIPTION OF THE INVENTION

A magnetic random access memory of an aspect of the present invention will be described below in detail with reference to the accompanying drawing.

1. Device Structure

Figure 1:
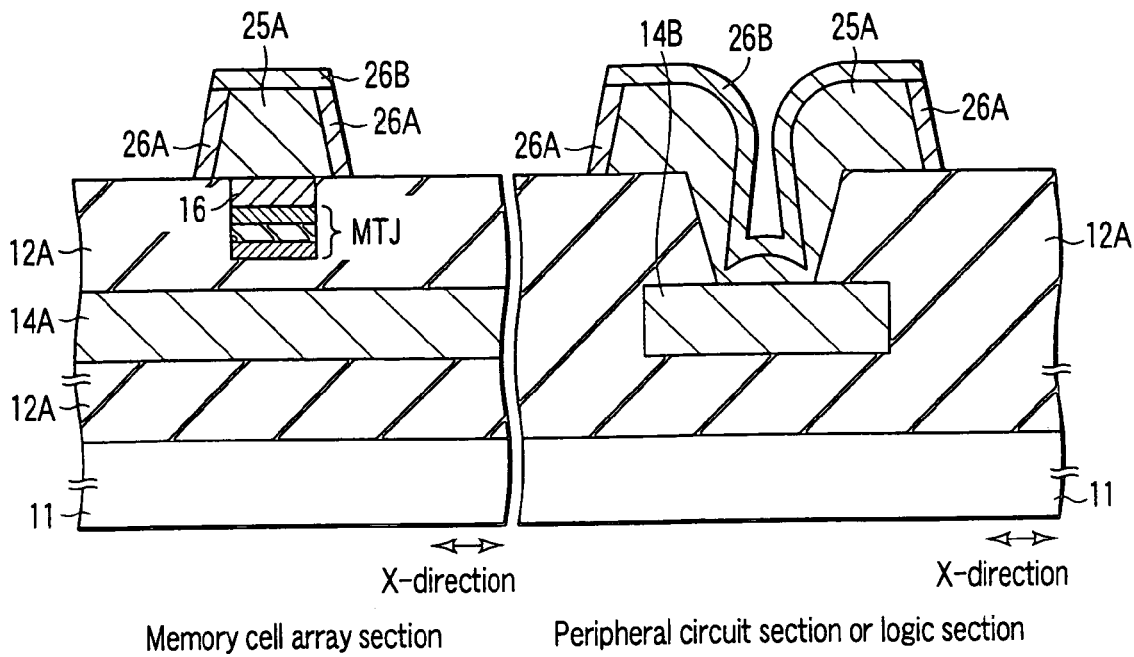
FIG. 1 is a cross-sectional view showing an example of a conventional device structure.
Figure 2:
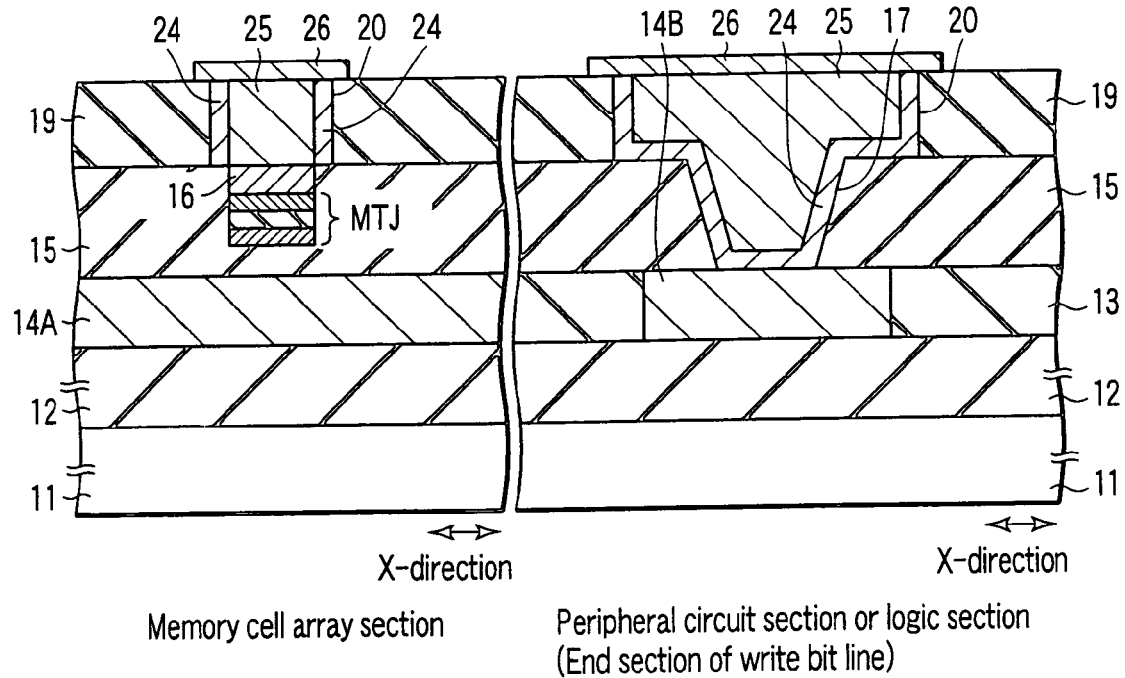
FIG. 2 is a cross-sectional view showing an example of a conventional device structure.
Figure 3:
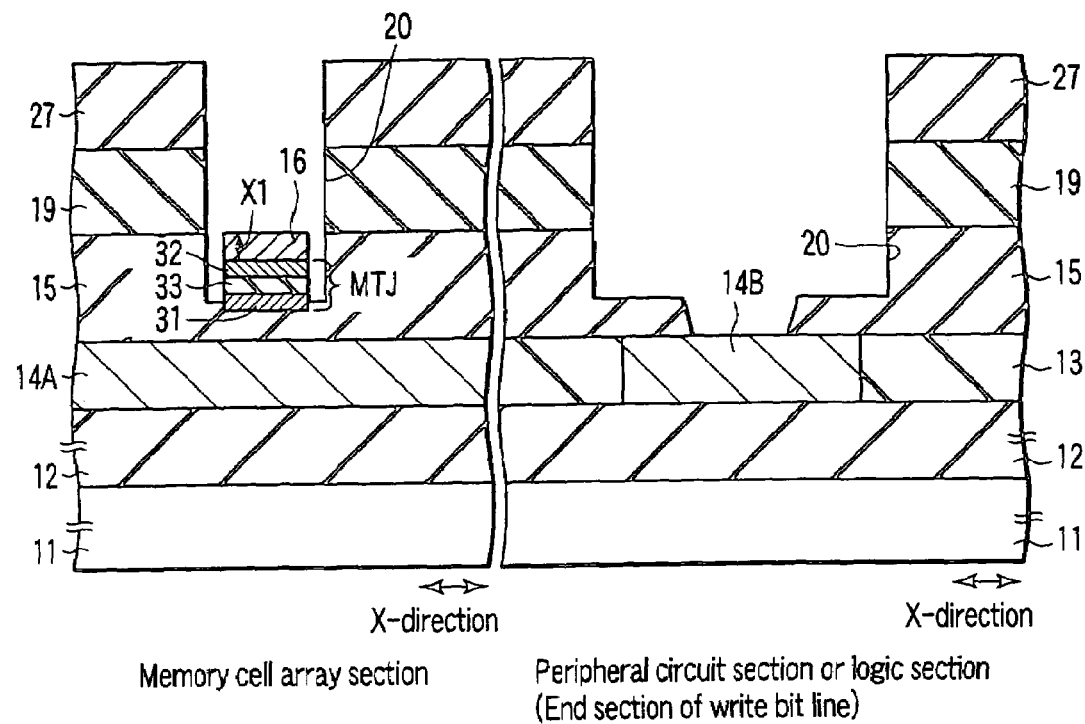
FIG. 3 is a cross-sectional view showing a problem in the conventional device structure.
Figure 4:
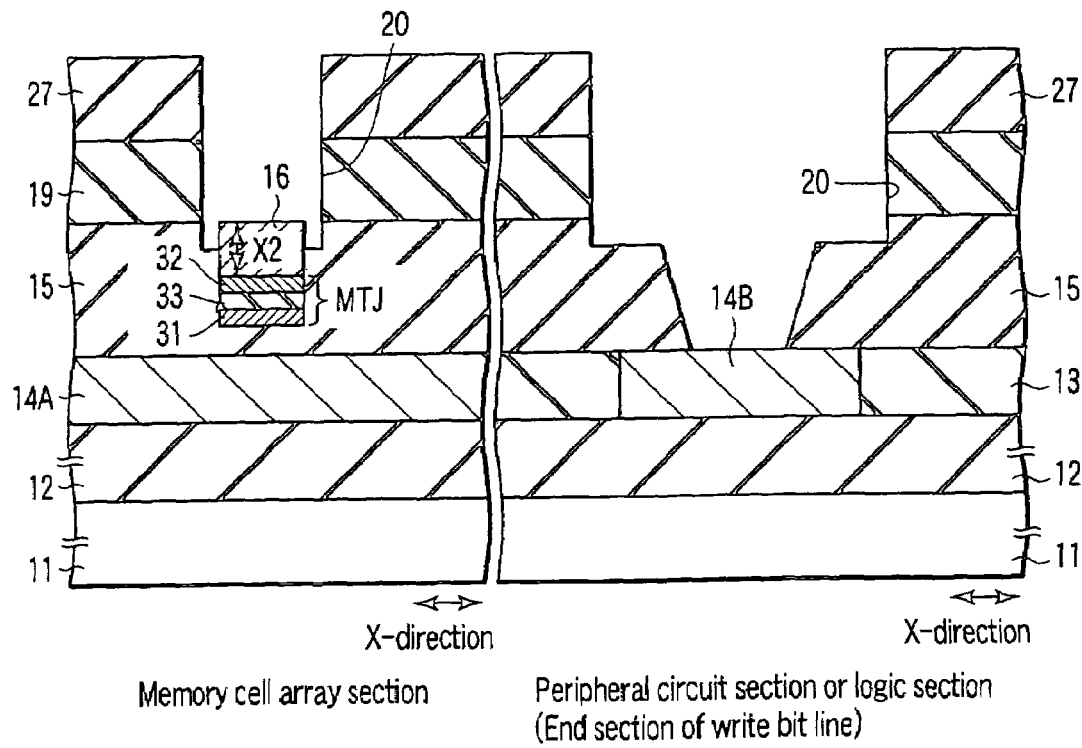
FIG. 4 is a cross-sectional view showing a problem in the conventional device structure.
Figure 5:
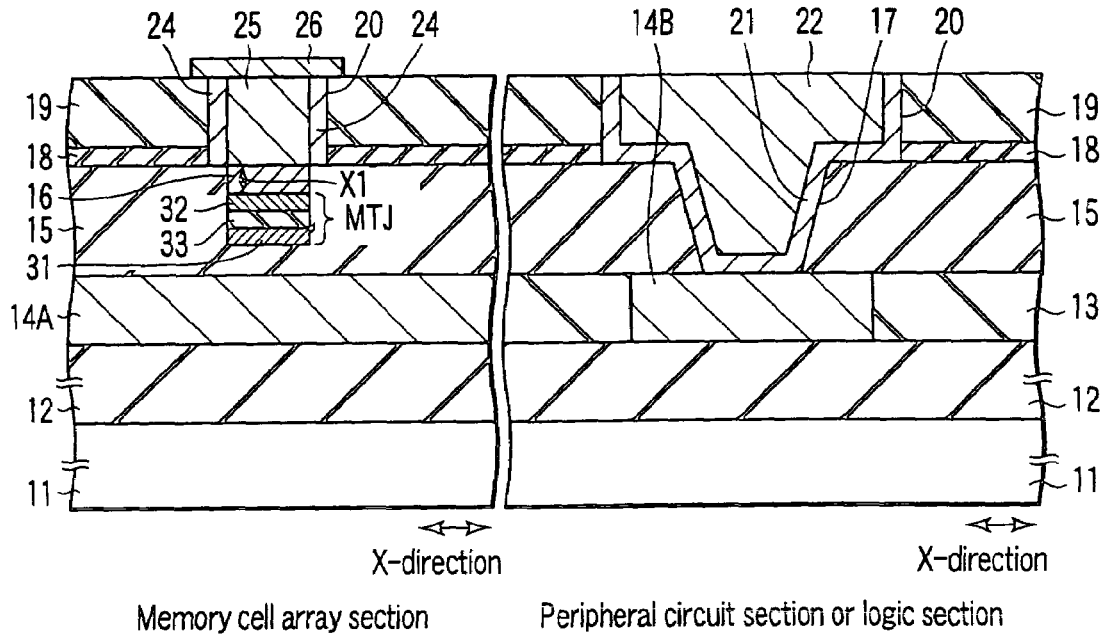
FIG. 5 is a cross-sectional view showing a device structure according to an example of the present invention.

FIG. 5 shows an example of a device structure of a magnetic random access memory according to an example of the present invention.

Insulating layers (e.g., silicon oxide) 12 and 13 are arranged on a silicon substrate 11. A plurality of wiring grooves are formed to the insulating layer 13, and a write word line 14A and a signal line 14B are arranged in these wiring grooves.

In a memory cell array section, an MTJ element MTJ is arranged above the write word line 14A. The MTJ element MTJ is surrounded by an insulating layer (e.g., silicon oxide) 15.

The MTJ element MTJ is constituted of a pin layer (fixed layer) 31 in which a magnetization state is fixed, a free layer (recording layer) 32 in which a magnetization state varies in accordance with data, and a tunnel insulating layer 33 arranged between these layers. The pin layer 31 and the free layer 32 are constituted of magnetic materials, and the tunnel insulating layer 33 is constituted of a non-magnetic material.

In this example, although the type of the MTJ element MTJ is a bottom pin type, in which the pin layer 31 is arranged on the silicon substrate 11 side, a top pin type in which the free layer 32 is arranged on the silicon substrate 11 side may be adopted in place of the former type, for example.

A write bit line 25 is arranged above the MTJ element MTJ through a cap layer 16. Yoke layers 24 and 26 which cause a magnetic field to efficiently act on the MTJ element MTJ are respectively arranged on side surfaces and a top surface of the write bit line 25. The write bit line 25 is filled in a wiring groove 20 formed to a silicon layer (e.g., silicon oxide) 19.

Here, in the example according to the present invention, a thickness X1 of the cap layer 16 is set to be 5 to 100 nm. As a result, a magnetic field generated by a write current flowing through the write bit line 25 can be caused to efficiently act on the MTJ element MTJ.

On the other hand, a thickness of the insulating layer 19 is set to 300 to 500 nm. Therefore, a bottom portion of the wiring groove 20 may possibly reach the MTJ element MTJ due to over-etching at the time of RIE which is performed in order to form the wiring groove 20 to the insulating layer 19.

Thus, in the example according to the present invention, an insulating layer (e.g., SiN, AlO$_3$, Al$_2$O$_3$ or the like) 18 having an etching selection ratio with respect to the insulating layers 15 and 19 is further arranged between the insulating layer 15 and the insulating layer 19. A thickness of this insulating layer 18 is set to 20 to 100 nm.

Since the insulating layer 18 is basically used as an etching stopper when forming the wiring groove 20, the insulating layer 18 existing on the bottom portion of the wiring groove 20 is removed after forming the wiring groove 20. Therefore, the insulating layer 18 is finally arranged between the insulating layer 15 and the insulating layer 19 except the bottom portion of the wiring groove 20.

Moreover, as to the insulating layer 18, a function to prevent molecules including hydrogen, oxygen and water or atoms constituting them from permeating may be added to this layer. By adding such a function, molecules or atoms can be prevented from entering from the insulating layer 19 and layers provided thereon or the outside of a chip, thereby improving the reliability of the MTJ element MTJ.

In a peripheral circuit section or a logic section, a signal line 22 is arranged above the signal line 14B. The signal line 22 is filled in a via hole 17 provided to the insulating layer 15 and the wiring groove 20 provided to the insulating layer 19, and has a so-called dual damascene structure. For example, a barrier metal 21 is arranged on a part of a surface of the signal line 22.

Here, in the example according to the present invention, the write bit line 25 in the memory cell array section and the signal line 22 in the peripheral circuit section or the logic section are simultaneously formed by, e.g., a damascene process, and hence they are formed of the same material (e.g., copper).

Figure 6:
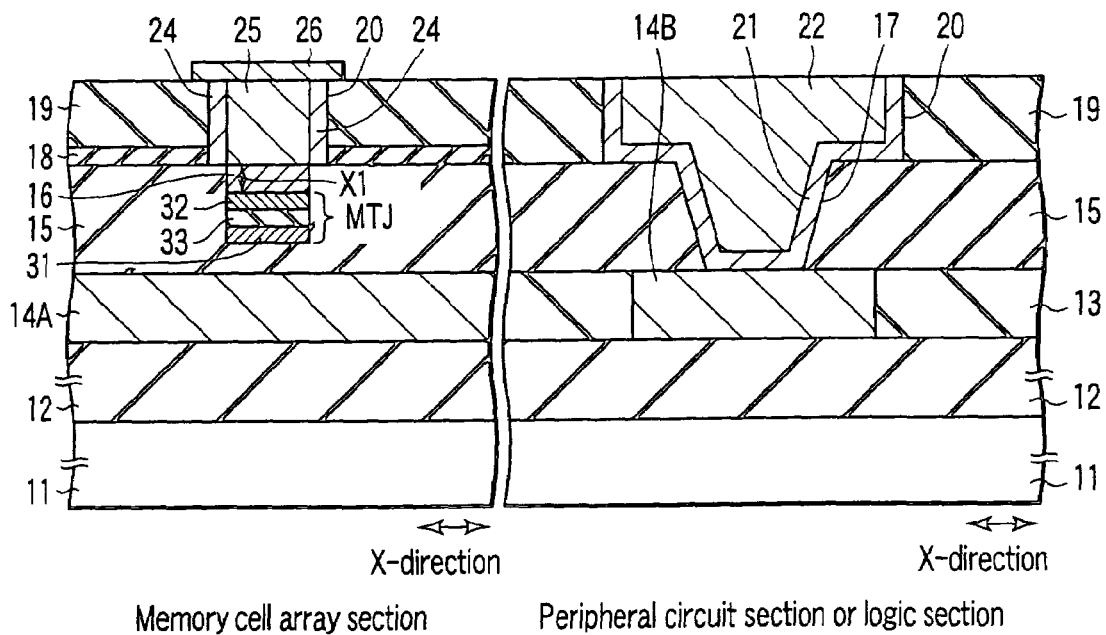
FIG. 6 is a cross-sectional view showing a device structure according to an example of the present invention.

In the peripheral circuit section or the logic section, as shown in FIG. 6, the insulating layer 18 is able to be omitted instead of FIG. 5. The insulating layer 18 is formed in the peripheral circuit section or the logic section in a manufacturing process, but over-etching when forming the wiring groove 20 is not a serious problem in the peripheral circuit section or the logic section, and hence this layer is peeled off.

In the example according to the present invention, it can be considered that the structure of the signal line 22 in the peripheral circuit section or the logic section is a structure at an end section of the write bit line 25 in the memory cell array section.

In this case, the structure depicted in FIG. 5 or FIG. 6 can be adopted as it is in the peripheral circuit section or the logic section, or a yoke wiring structure may be adopted in place of this as shown in FIG. 7, for example.

As described above, according to such a device structure, in the magnetic random access memory having a cell array structure in which the wiring formed by the damascene process is provided above the MTJ element through the cap layer, since the insulating layer as an etching stopper is arranged above the MTJ element, it is possible to provide a device structure with a high reliability in which the MTJ element does not short-circuit even if a distance between the MTJ element and the wiring is shortened.

Additionally, providing the insulating layer as the etching stopper can reduce irregularities in the depth of the wiring grooves, especially irregularities in cross sectional area of the write wiring formed in the wiring groove. Therefore, unevenness in a magnetic field generated at the time of writing can be eliminated, thereby realizing stability in writing.

2. Manufacturing Method

A method for manufacturing the device shown in FIG. 5 or FIG. 6 will now be described.

Figure 8:
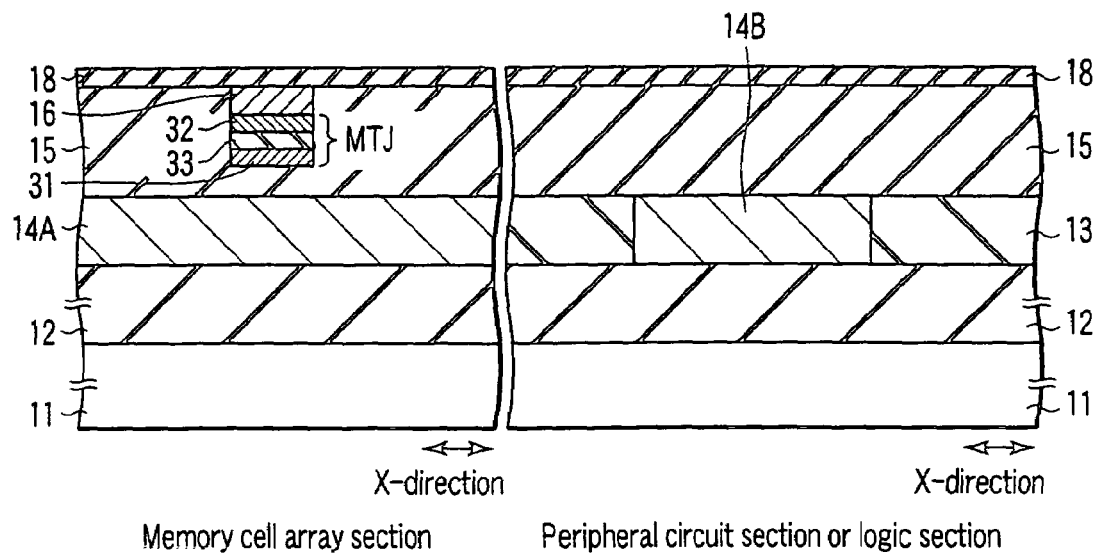
FIG. 8 is a cross-sectional view showing a step in a manufacturing method according to an example of the present invention.

First, as shown in FIG. 8, insulating layers 12 and 13 are formed on a silicon substrate 11 by, e.g., CVD. A plurality of wiring grooves are formed to the insulating layer 13 by PEP and RIE. Thereafter, a write word line 14A and a signal line 14B are formed in the wiring grooves provided to the insulating layer 13 by using CVD and CMP.

An MTJ element MTJ and a cap layer 16 are formed above the write word line 14A, and the MTJ element MTJ and the cap layer 16 are surrounded by an insulating layer 15. A top surface of the insulating layer 15 is flattened by CMP, and is made to be substantially at the same level as that of a top surface of the cap layer 16.

Thereafter, an insulating layer 18 having a thickness of, e.g., 20 to 100 nm is formed on the insulating layer 15 by CVD. This insulating layer 18 is constituted of, e.g., silicon nitride, and formed on the entire insulating layer 15.

Figure 9:
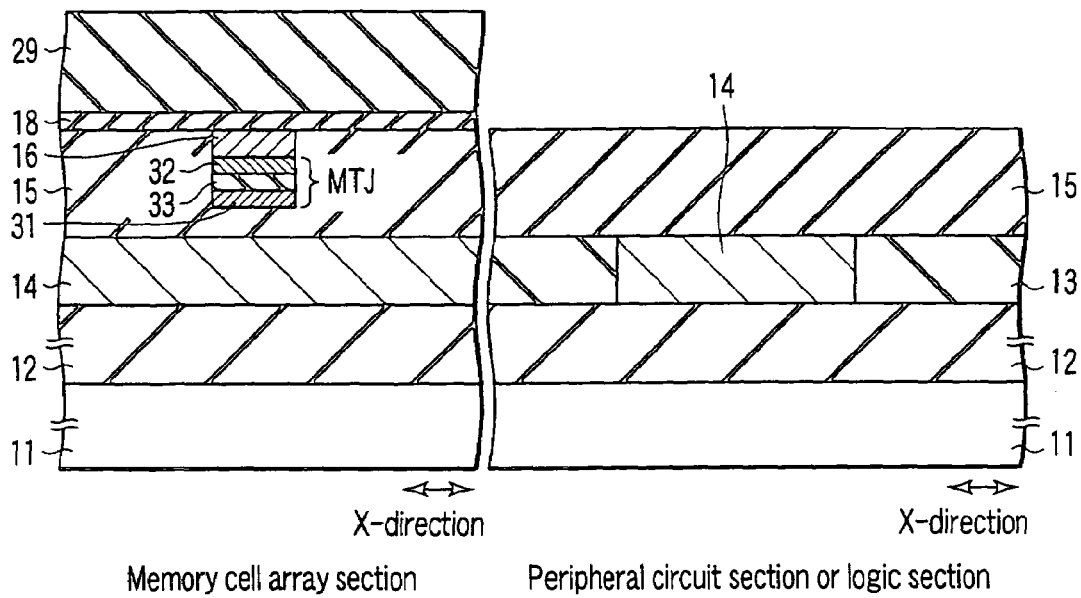
FIG. 9 is a cross-sectional view showing a step in the manufacturing method according to an example of the present invention.

A case of FIG. 6, as shown in FIG. 9, a resist mask 29 which covers the memory cell array section is formed by PEP. Then, the insulating layer 18 is etched by RIE by using this resist mask 29 as a mask. As a result, the insulating layer 18 is removed in the peripheral circuit section or the logic section, and the insulating layer 15 is exposed. Thereafter, the resist mask 29 is peeled off.

Figure 10:
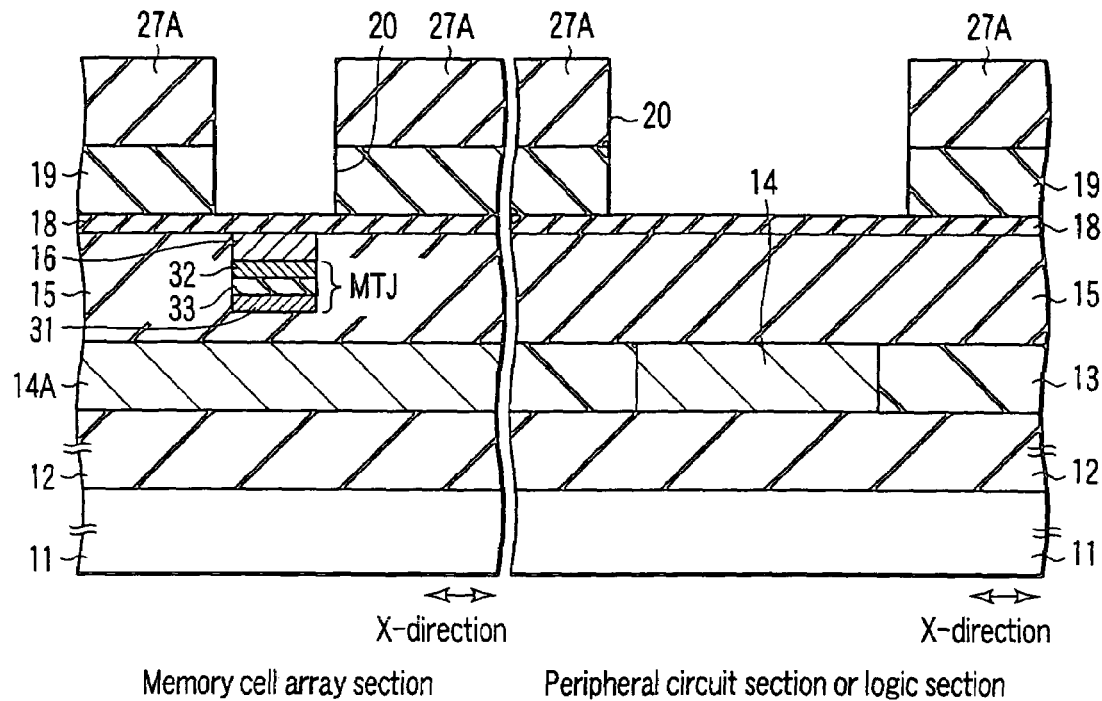
FIG. 10 is a cross-sectional view showing a step in the manufacturing method according to an example of the present invention.

Then, as shown in FIG. 10, an insulating layer 19 having a thickness of, e.g., 300 to 500 nm is formed on the insulating layers 15 and 18 by CVD.

A resist mask 27A is formed on the insulating layer 19 by PEP. Then, the insulating layer 19 is etched by RIE with this resist mask 27A being used as a mask. As a result, a wiring groove 20 is formed to the insulating layer 19. At this time, since the insulating layer 18 demonstrates a function as the etching stopper in the memory cell array section, the MTJ element MTJ is not exposed on the bottom portion of the wiring groove 20 by over-etching.

Figure 11:
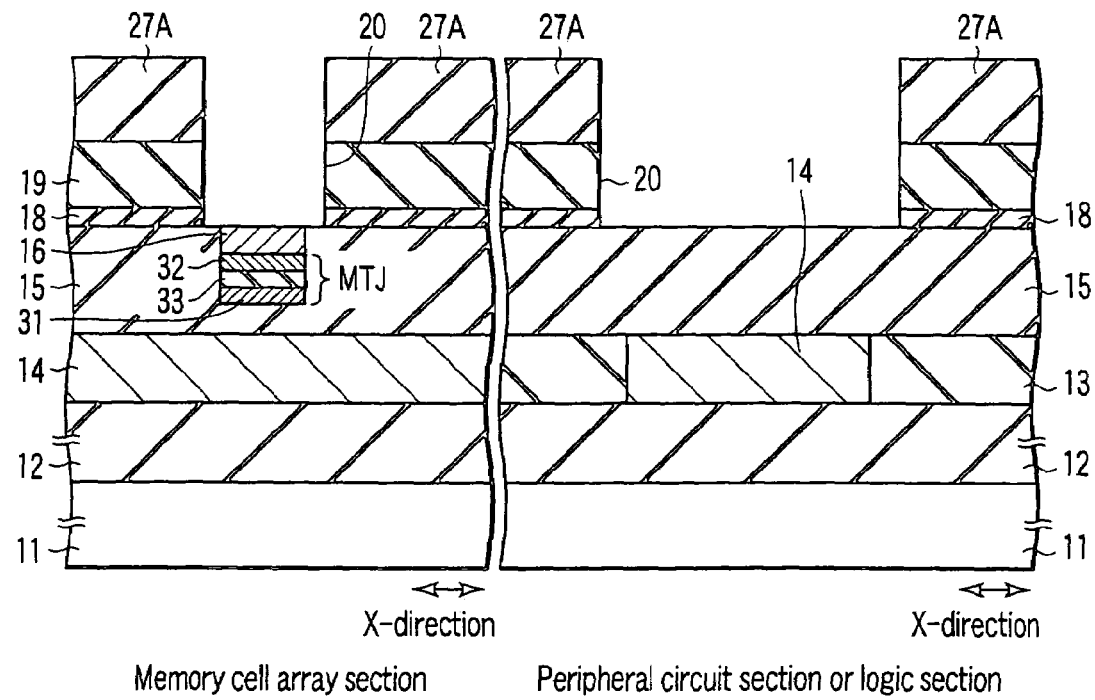
FIG. 11 is a cross-sectional view showing a step in the manufacturing method according to an example of the present invention.

Subsequently, as shown in FIG. 11, the insulating layer 18 exposed on the bottom portion of the wiring groove 20 is etched by RIE with the resist mask 27A being used as a mask. At this time, since a thickness of the insulating layer 18 is not more than, e.g., 80 nm which is very thin, an over-etching quantity is small when etching the insulating layer 18, and hence the MTJ element MTJ is not exposed.

Thereafter, the resist mask 27A is peeled off.

Figure 12:
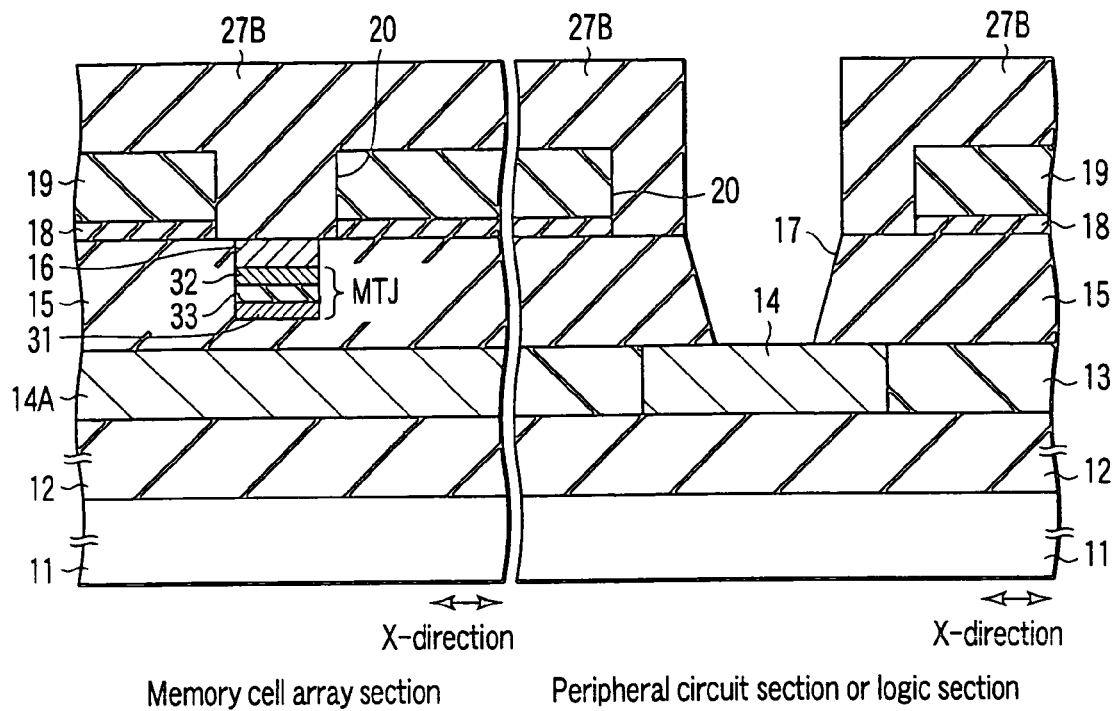
FIG. 12 is a cross-sectional view showing a step in the manufacturing method according to an example of the present invention.

Then, as shown in FIG. 12, a resist mask 27B is formed on the insulating layers 15 and 19 by PEP. Further, the insulating layer 15 is etched by RIE with this resist mask 27B being used as a mask. As a result, a via hole 17 is formed to the insulating layer 15.

Subsequently, the resist mask 27B is peeled off.

Figure 13:
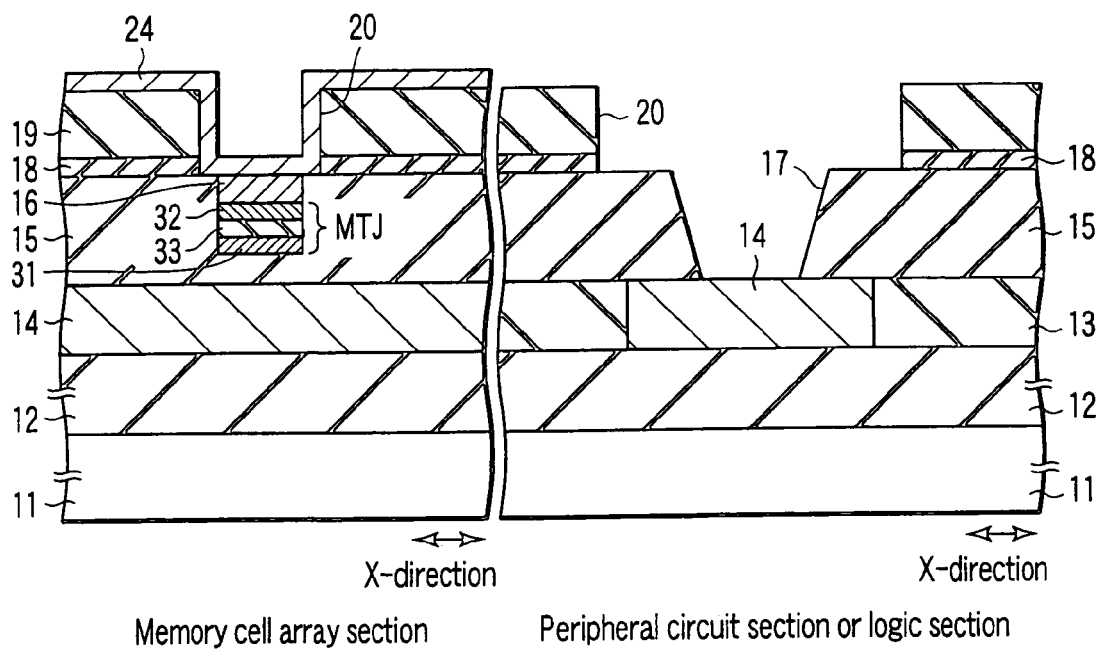
FIG. 13 is a cross-sectional view showing a step in the manufacturing method according to an example of the present invention.

Then, as shown in FIG. 13, a yoke layer (e.g., Permalloy) 24 is formed on the insulating layer 19 by CVD, and the yoke layer 24 in the peripheral circuit section or the logic section is removed. In the memory cell array section, the yoke layer 24 is formed so as to cover the bottom portion and the side surfaces of the wiring groove 20.

Figure 14:
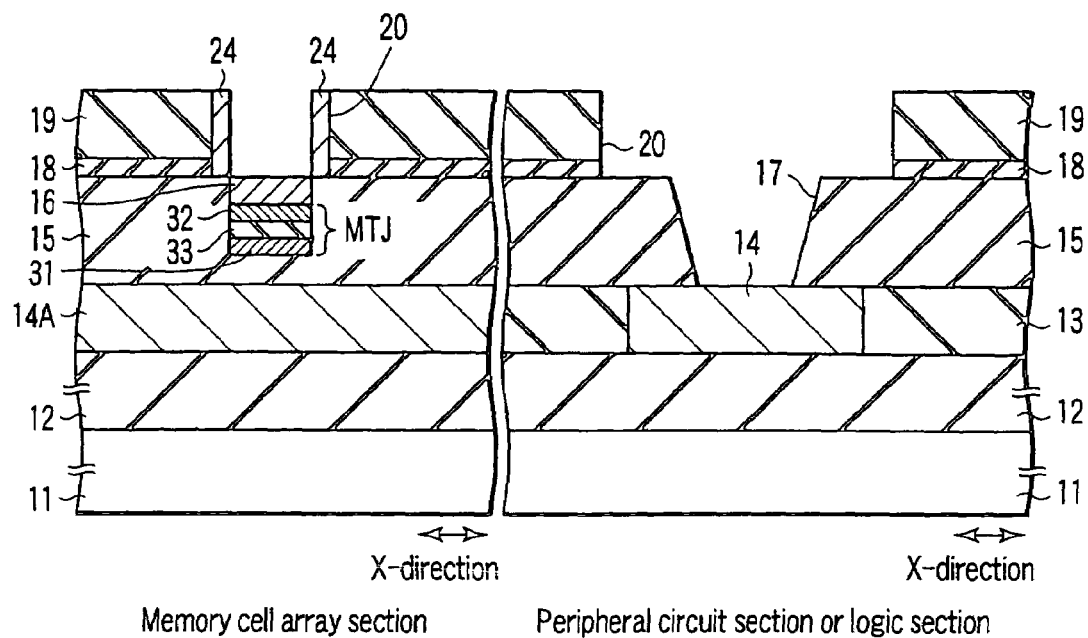
FIG. 14 is a cross-sectional view showing a step in the manufacturing method according to an example of the present invention.

Subsequently, as shown in FIG. 14, the yoke layer 24 is etched by RIE. As a result, the yoke layer 24 remains only on side walls of the wiring groove 20 in the memory cell array section.

Figure 15:
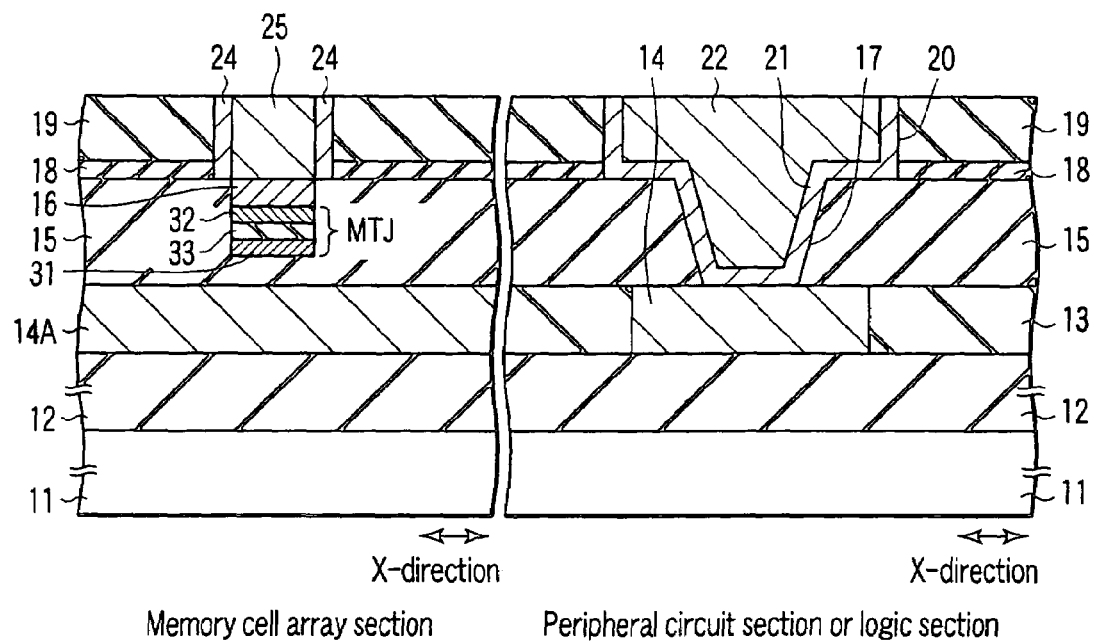
FIG. 15 is a cross-sectional view showing a step in the manufacturing method according to an example of the present invention.

Then, as shown in FIG. 15, a barrier metal 21 which covers the surfaces of the via hole 17 and the wiring groove 20 is formed by CVD in the peripheral circuit section or the logic section.

Thereafter, electroconductive layers (e.g., Cu) 22 and 25 which completely fill the via hole 17 and the wiring groove 20 are formed by CVD. Then, the barrier metal 21 and the electroconductive layers 22 and 25 are polished by CMP, and they are caused to remain only in the via hole 17 and the wiring groove 20. As a result, a signal line 22 and a write bit line 25 are formed.

Figure 16:
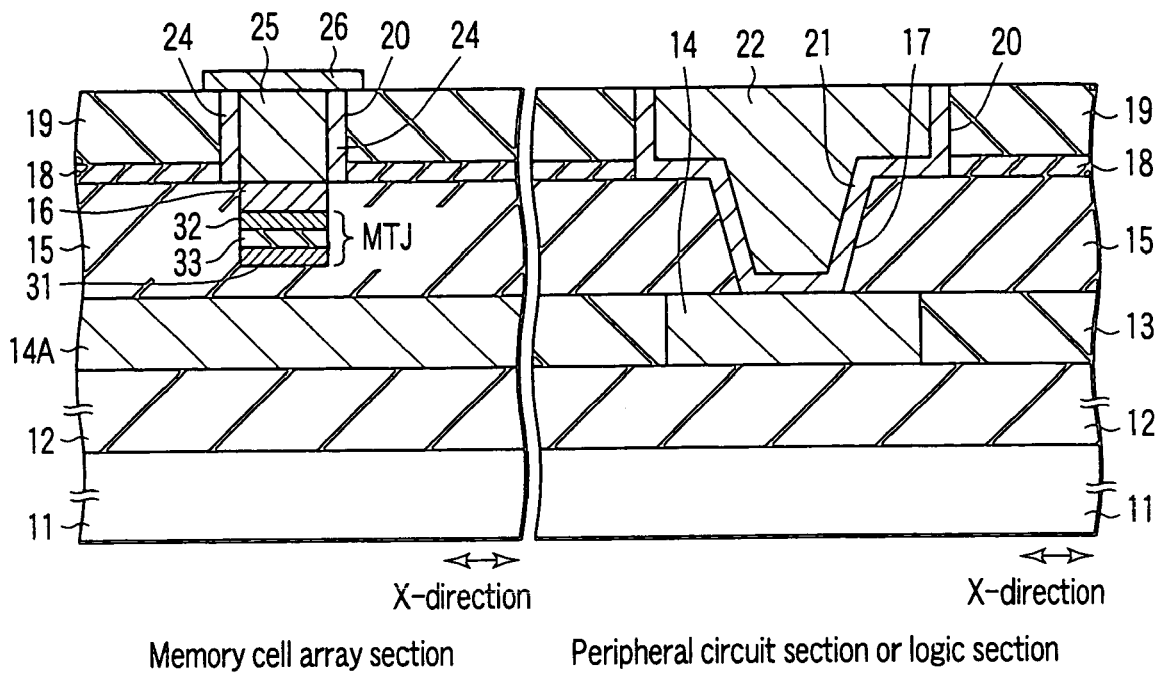
FIG. 16 is a cross-sectional view showing a step in the manufacturing method according to an example of the present invention.

At last, as shown in FIG. 16, a yoke layer 26 is formed on the insulating layer 19 by CVD, and this yoke layer 26 is patterned by PEP and RIE. As a result, the yoke layer 26 is formed on the write bit line 25.

The device depicted in FIG. 5 or FIG. 6 is brought to completion by the above-described steps.

According to such a manufacturing method, in the memory cell array section, since the insulating layer 18 functions as the etching stopper when forming the wiring groove 20, the MTJ element MTJ is not exposed due to over-etching when forming the wiring groove 20. Furthermore, as to etching the insulating layer 18 existing on the bottom portion of the wiring groove 20, since the insulating layer 18 is sufficiently thin, an over-etching quantity at this time is very small, which does not result in a bit defect.

3. Embodiment

Figure 17:
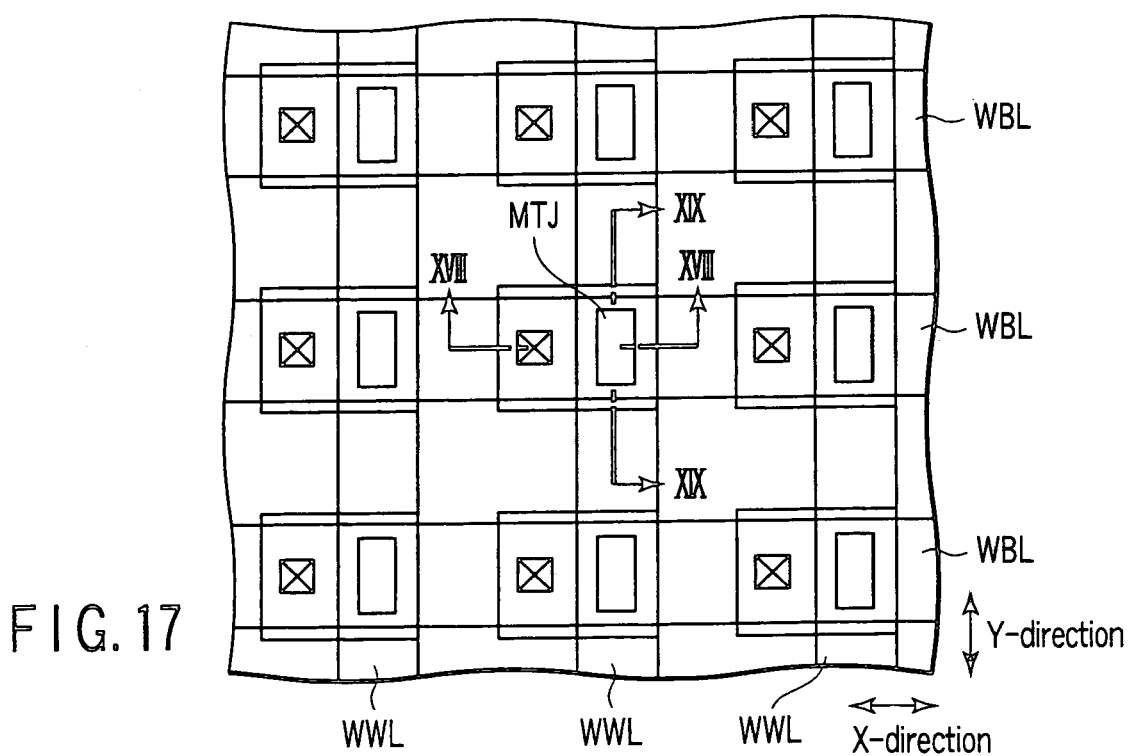
FIG. 17 is a plane view showing an embodiment of a device structure according to an example of the present invention.
Figure 18:
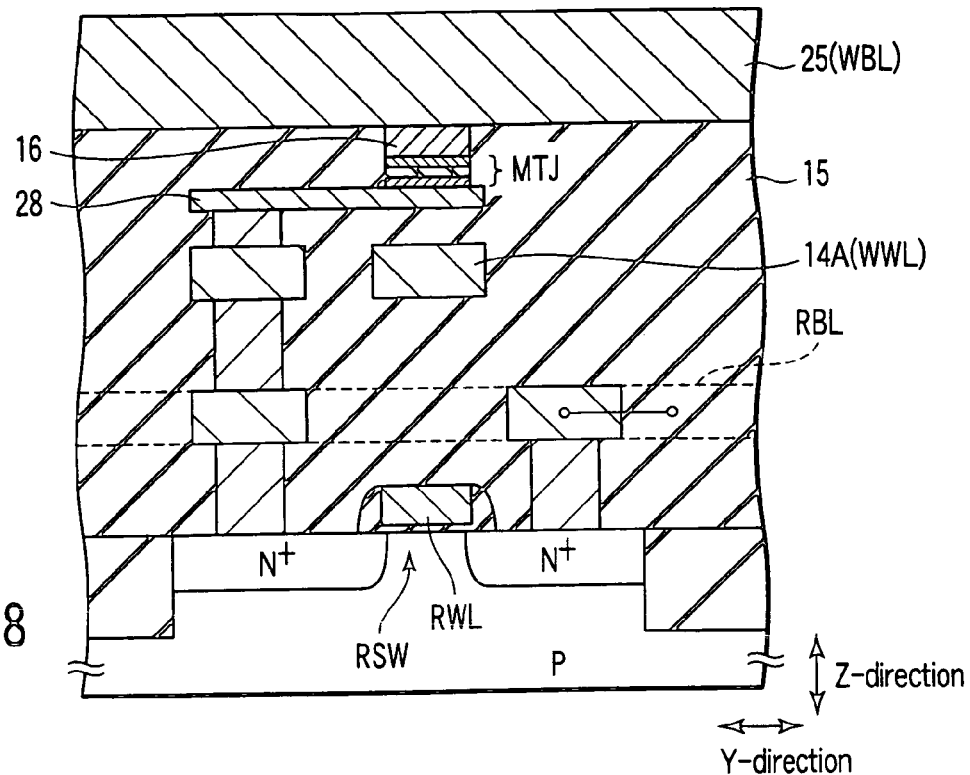
FIG. 18 is a cross-sectional view taken along the line XVIII—XVIII in FIG. 17.
Figure 19:
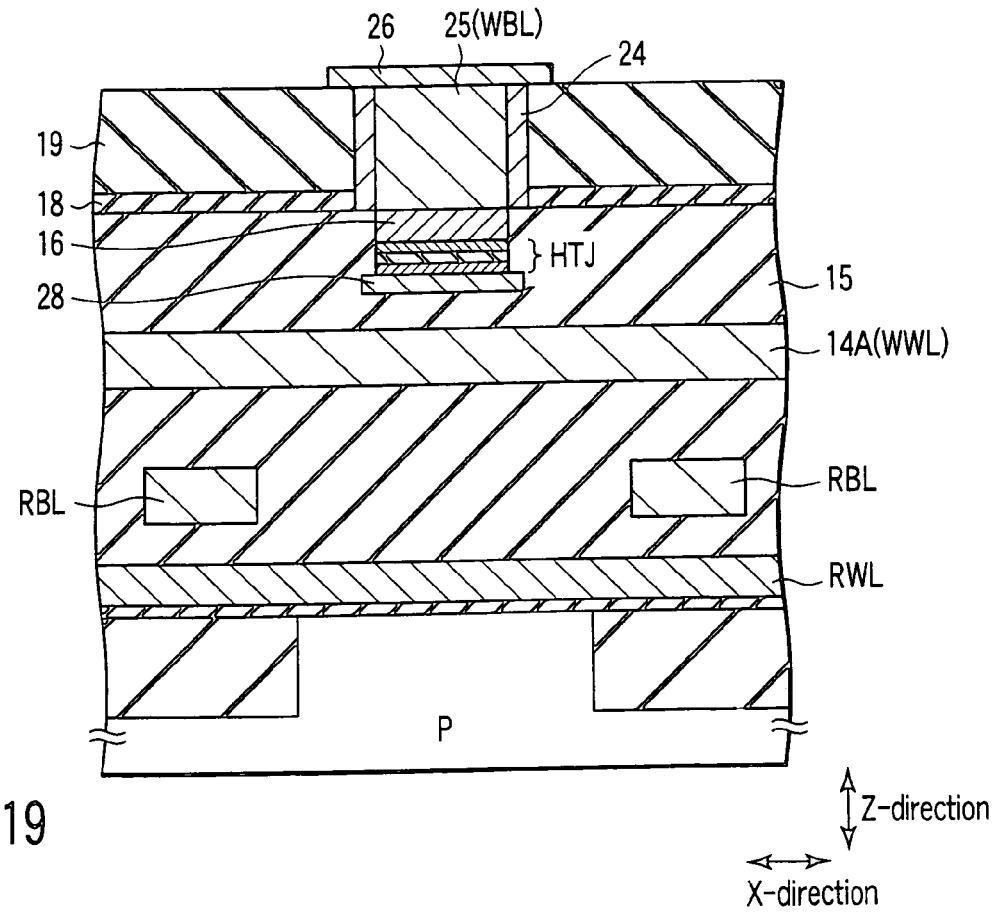
FIG. 19 is a cross-sectional view taken along the line XIX—XIX in FIG. 17.

FIGS. 17 to 19 show an example of a magnetic random access memory having a device structure concerning the example of the present invention. FIG. 18 shows a cross section taken along the line XVIII—XVIII in FIG. 17, and FIG. 19 shows a cross section taken along the line XIX—XIX in FIG. 17.

In this example, the device structure concerning the example of the present invention is applied to a magnetic random access memory having a cell array structure which is of a one-transistor/one-MTJ type.

An N channel MOS transistor as a read selection switch RSW is formed in a surface area of a P type silicon substrate. A gate of this transistor is a read word line RWL and extends in, e.g., an X-direction.

One of two source/drain areas of the N channel MOS transistor as the read selection switch RSW is connected with a read bit line RBL. The read bit line RBL extends in, e.g., a Y-direction and is connected with a read circuit (including a sense amplifier). The other one of the two source/drain areas is connected with an electroconductive plate 28.

An MTJ element MTJ is arranged on the electroconductive plate 28. A write word line WWL extending in the X-direction is arranged directly below the MTJ element MTJ. The write word line WWL is separated from the MTJ element MTJ by a fixed distance. A write current which is directed in one direction flows through the write word line WWL at the time of writing.

A cap layer (conductor) 16 is arranged on the MTJ element MTJ. The MTJ element MTJ and the cap layer 16 both have, e.g., a square shape or a rectangular shape which is long in the X-direction. Here, the X-direction is a direction parallel with a magnetization easy axis of the MTJ element MTJ, and a Y-direction is a direction parallel with a magnetization hard axis of the MTJ element MTJ.

A write bit line WBL extending in the Y-direction is arranged on the cap layer 16. The write bit line WBL is electrically connected with the MTJ element MTJ through the cap layer 16. Yoke layers 24 and 26 are arranged on a top surface and side surfaces of the write bit line WBL. A write current which is directed in one direction or the other direction flows through the write bit line WBL in accordance with a value of write data.

An insulating layer 18 concerning the example of the present invention is arranged between insulating layers 15 and 19. This insulating layer 18 does not exist directly below the write bit line WBL.

Actually applying the device structure concerning the example of the present invention to the cell array structure of the magnetic random access memory in this manner can contribute to a reduction in write current.

4. Others

The magnetic random access memory concerning the example of the present invention can be also applied to an LSI in which a memory function and a logic function (calculation, control and others) are both formed in a chip as well as a unit memory in which only a memory function is formed in a chip.

Furthermore, since the example of the present invention is not restricted to a layer structure or a shape of the MTJ element, it can be applied to various kinds of magnetic random access memories.

For example, the example of the present invention can be applied to magnetic random access memories having an MTJ element with a top pin structure as well as an MTJ element with a bottom pin structure, and it can be also applied to a magnetic random access memory having a cruciform MTJ element.

Moreover, although the description has been given as to the cell array structure which is of the one-transistor/one-MTJ type in the foregoing embodiment, the magnetic random access memory concerning the example of the present invention can be also applied to a cell array structure which is of any other type, e.g., a cell array structure which is of a one-transistor/n-(n is a plural number)MTJ type, a ladder type, a lamination type, a cross point type or the like.

Additionally, although the description has been given as to the structure and the manufacturing method in which the cap layer as an electroconductive layer is arranged on the MTJ element in the foregoing embodiment, it is possible to propose a structure in which the cap layer is determined as an insulating layer such as Al2O3 and the cap layer does not exist by removing this cap layer immediately before filling an electroconductive layer (e.g., Cu) as the write bit line in the processes in FIGS. 7 to 15, for example.

According to the example of the present invention, in the magnetic random access memory having the cell array structure in which the wiring formed by the damascene process is provided on the MTJ element through the cap layer, it is possible to provide the device structure with the high reliability in which the MTJ element does not short-circuit even if the cap layer is thinned and a distance between the MTJ element and the wiring is reduced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A magnetic random access memory, comprising:
   a magneto resistive element;
   a first insulating layer which covers side surfaces of the magneto resistive element;
   a second insulating layer which is arranged on the first insulating layer and has a first groove on the magneto resistive element;
   a write line which fills the first groove and is connected with the magneto resistive element and which is in contact with side surfaces of the second and third insulating layers; and
   a third insulating layer which is arranged between the first and second insulating layers except a bottom portion of the first groove and has an etching selection ratio with respect to at least the first and second insulating layers.

2. The magnetic random access memory according to claim 1,
   wherein the second insulating layer has a second groove around a memory cell array section in which the magneto resistive element is arranged, an electroconductive layer is filled in the second groove, and the third insulating layer exists only in the memory cell array section.

3. The magnetic random access memory according to claim 1, wherein the third insulating layer has a function to prevent molecules including hydrogen, oxygen and water or atoms constituting them from permeating.

4. The magnetic random access memory according to claim 3, wherein the third insulating layer is one of SiN, AlO$_3$ and Al$_2$O$_3$.

5. The magnetic random access memory according to claim 4, wherein a free layer of the magneto resistive element is in contact with the cap layer.

6. The magnetic random access memory according to claim 4, wherein a pin layer of the magneto resistive element is in contact with the cap layer.

7. The magnetic random access memory according to claim 1, further comprising a cap layer which is arranged between the magneto resistive element and the write line and has a thickness of 5 to 100 nm.

8. The magnetic random access memory according to claim 1, wherein a thickness of the second insulating layer is 300 to 500 nm, and a thickness of the third insulating layer is 20 to 100 nm.

9. The magnetic random access memory according to claim 1, wherein the write line is constituted of an electroconductive layer and yoke layers which cover at least all or part of a surface of the electroconductive layer except a bottom surface thereof.

10. The magnetic random access memory according to claim 9, wherein the electroconductive layer is constituted of copper.

11. The magnetic random access memory according to claim 1, wherein an easy axis of the magneto resistive element is directed in a direction vertical to a direction along which the write line extends.

12. The magnetic random access memory according to claim 1, wherein the magneto resistive element is connected with a MOS transistor arranged directly below the magneto resistive element.

13. The magnetic random access memory according to claim 1, wherein another write line orthogonal to the write line is arranged below the magneto resistive element.

14. The magnetic random access memory according to claim 1, wherein a bottom surface of the write line exists at the level of a top surface of the first insulating layer.

* * * * *